(12) United States Patent
Bull et al.

(10) Patent No.: US 7,793,082 B2
(45) Date of Patent: Sep. 7, 2010

(54) LATCH TO BLOCK SHORT PATH VIOLATION

(75) Inventors: David Michael Bull, Balsham (GB); Shidhartha Das, Ann Arbor, MI (US)

(73) Assignee: ARM Limited, Cambridge (GB)

( * ) Notice: Subject to any disclaimer, the term of this patent is extended or adjusted under 35 U.S.C. 154(b) by 688 days.

(21) Appl. No.: 11/638,703

(22) Filed: Dec. 14, 2006

(65) Prior Publication Data
US 2008/0086624 A1 Apr. 10, 2008

(30) Foreign Application Priority Data
Oct. 9, 2006 (GB) ................................. 0619949.1

(51) Int. Cl.
*G06F 7/00* (2006.01)
(52) U.S. Cl. ...................................... 712/220
(58) Field of Classification Search .................. 712/220
See application file for complete search history.

(56) References Cited

U.S. PATENT DOCUMENTS

2005/0246613 A1  11/2005  Blaauw et al.

FOREIGN PATENT DOCUMENTS

WO  WO-A-2004/084072  9/2004

OTHER PUBLICATIONS

Hennessy and Patterson, Computer Organization and Design, 1998, Morgan Kaufmann Publishers, Second Edition, p. 499.*
The Master-Slave Flip-Flop at http://www.shef.ac.uk/physics/teaching/phy107/msff.html.*
Shen, John Paul. Lipasti, Mikko. "Modern Processor Design: Fundamentals of Superscalar Processors". McGraw Hill, 2005. pp. 29-31 and 100.*

* cited by examiner

*Primary Examiner*—Eddie P Chan
*Assistant Examiner*—Robert Fennema
(74) *Attorney, Agent, or Firm*—Nixon & Vanderhye P.C.

(57) ABSTRACT

An integrated circuit includes processing pipeline stages formed of an input register, processing circuit and an output register. The output register employs speculative sampling and uses a subsequent speculation period during which any change in its input is detected and used to indicate a speculation error. In order to reduce the chances of a race condition giving rise to a false positive detection of a speculation error due to a too rapid signal propagation through the processing circuitry a transparent latch is disposed at the approximate midpoint, measured in terms of propagation delay, within the processing circuitry. This transparent latch is non-transmissive during the speculation period of the output register so as to prevent any new signal propagating from the input register during the speculation period from reaching the output register.

25 Claims, 4 Drawing Sheets

LATCH TO BLOCK SHORT PATH VIOLATION

TECHNICAL FIELD

The technology described herein relates to the field of integrated circuits. More particularly, the technology described herein relates to integrated circuits using speculative sampling of a speculative value upon which further processing in subsequent pipeline states progresses before it is determined at the end of a speculation period whether that speculative value was or was not correct.

BACKGROUND

It is know to provide data processing systems which sample signal values to form speculative values, the correctness of which are determined at a later time. This allows processing to proceed more rapidly and reduces the amount of margin which needs to be introduced into signal timing so as to cater for worst case performance. An example of such systems are the integrated circuits proposed in WO-A-2004/084072 (embodying an example of so-called Razor techniques).

The above techniques are normally targeted at paths which are slow and performance limiting with the output signal from that path only becoming available close to the required sampling time. Normally, a timing margin is provided to ensure that the correct signal value will be available to be sampled even in worst case operating conditions. The Razor techniques allow this margin to be reduced and yet incorrect operation avoided by sampling the signal value at an aggressively timed point corresponding to the circuit operating at high speed (low voltage, or in accordance with some other performance constraining parameter) and then detecting whether a change in that value being sampled occurs within a subsequent speculation period. If a change does occur, then this is indicative of an incorrect value having been sampled as the speculative value and error recovery operation is triggered.

A problem which can arise in such systems is that a path upon which this type of technique is being used may be critically slow in some circumstances and yet fast in others. When it is fast, then during the speculation period following the speculative sampling the value at the sampling position may validly change due to a new correct value for the following processing cycle propagating through the fast path and reaching the sampling point during the speculation period associated with the previous processing cycle. This behaviour can be considered to correspond to an "race" condition in which the next signal value progresses too rapidly through the processing logic and arrives at the sampling point sufficiently early that it is incorrectly identified as a change in the previous signal value as a consequence of that previous signal value being sampled too early.

One way of dealing with this problem is to insert signal delay buffers in the fast paths to slow these down sufficiently that such race conditions will not arise and short path errors will not be induced. However, the circuit area and power overhead associated with inserting such buffer delays deliberately to slow signal propagation can be significant.

Another problem associated with some implementations of the Razor techniques is that of using the clock signal to define the speculation period. The boundaries of the speculation period need to be signaled to the many different points within the integrated circuit which have employed speculative sampling in circumstances where the path delay concerned gives rise to a significant probability that the speculative value will be incorrect. Using one phase of the clock period to define this speculation period has the advantage that separate speculation defining signals do not have to be widely routed through the integrated circuit. However, controlling the length of the phase being used to indicate the speculation period throughout the integrated circuit in a manner which reliability and consistently defines the speculation period such that errors will be detected and false positives not occur, whilst also taking into account the inevitable variations resulting from process variation within the integrated circuit, represents a significant practical difficulty.

SUMMARY OF THE INVENTION

Viewed from one aspect the present invention provides an integrated circuit comprising:

at least one processing pipeline stage having an input register, processing circuitry coupled to said input register to receive an input signal therefrom, and an output register coupled to said processing circuitry to receive an output signal therefrom; wherein said output register samples said output signal at a speculative sampling point to form a speculative value, outputs said speculative value as a downstream input signal to one or more further processing pipeline stages during at least a speculation period, and is responsive to a change in said output signal during said speculation period to trigger an error recovery operation; and said processing circuitry includes at least one latch disposed in a signal path between said input register and said output register, said at least one latch being responsive to a latch control signal to be non-transmissive during a period matched to said speculation period so as to block a change in said input signal resulting in a change in said output signal during said speculation period.

The inventors recognized that using a latch disposed in the signal path to positively block signal propagation past the latch during a period matched to the speculation period provides resistance to race conditions giving rise to false positive detection of errors and improves robustness when using a clock phase to define the speculation period. The latch is non-transmissive during substantially the speculation period such that a signal progressing rapidly along the signal path will not progress beyond the latch and risk reaching the output register too soon in a way which is misinterpreted as a speculation error. It will be appreciated that the period during which the latch is non-transmissive need not be identical to the speculation period as a combination of the latch and a few buffers could be used to permit some overlap in the latch open and the speculation periods with the delay buffers ensuring no overlap at the input to the output register. This arrangement can be used to relax the constraints on the precise timing of the negative clock edge.

In some embodiments the latch can comprise a transparent latch. The use of a transparent latch has the advantage that once the latch is transmissive then signal values arriving at it will be transmitted therethrough even if they arrive late at the transparent latch. Thus, if the portion of the signal path upstream of the transparent latch for some reason is relatively slow, then the time can be made up in the portion of the signal path downstream of the transparent latch before the signal reaches the output register.

It will be appreciated that in a simple form the pipeline stage can comprise a single input register followed by processing circuitry and a single output register. However, in most real life systems the arrangement is more complex with potentially multiple input registers leading into the processing circuitry and potentially multiple output registers deriving signals therefrom. This is the normal fan-in and fan-out arrangement associated with signal paths and signal nodes within integrated circuits. The present techniques are equally applicable in such circumstances with latches being placed between an input register and an output register in at least those signal paths deemed to be at risk of a race condition giving rise to a false positive speculation error detection.

Whilst it is possible for the processing circuitry to be disposed in a variety of different ways relative to the latch, in some embodiments the processing circuitry is arranged such that substantially the same propagation delay takes place upstream of the latch as takes place downstream of the latch. This conveniently allows a standard approximate 50% duty ratio clock to be used for defining the speculation period and also controlling the latch. The latch could however be controlled by its own dedicated signal if required.

The input register and the output register can have sampling points defined by a given edge transition within the periodic clock signal. It will be appreciated that the output register of one processing stage will typically form the input register for a following processing stage.

Within the field of integrated circuits it is known to employ clock gating techniques to reduce the power consumption associated with clock signal distribution. The control of the latch can also be subject to clock gating to reduce its power consumption and this is conveniently achieved by making this clock gating dependent upon clock gating applied to the corresponding input register. This simplifies the provision of clock gating for the latch since the clock gating signals for the input register will normally be available at the latest by the end of the previous cycle making them early enough to be used to control clock gating of the latch provided to address the short path problem.

The output register serves to detect a change in the output signal from the processing circuitry during the speculation period. This may be achieved in a variety of ways: one example (e.g. WO-A-2004/084072) sampling the output signal at the speculative sampling point and also at the end of the speculation period, comparing these values and indicating an error if there is a difference; or in another example (e.g. 2005/246613) by use of a transition detector active for the speculation period and responsive to any transition within the output signal during the speculation period to generate an error signal. The current technique is applicable to both of these ways of forming the output register as well as other ways of forming the output register which are able to provide the speculative output to a further stage with the capability of error correction if the speculative output is determined to be incorrect.

Viewed from another aspect the present invention provides an integrated circuit comprising:

at least one processing pipeline stage having input register means, processing means coupled to said input register means for receiving an input signal therefrom, and an output register means coupled to said processing means for receiving an output signal therefrom; wherein said output register means samples said output signal at a speculative sampling point to form a speculative value, outputs said speculative value as a downstream input signal to one or more further processing pipeline stages during at least a speculation period, and is responsive to a change in said output signal during said speculation period to trigger an error recovery operation; and said processing means includes at least one latch means disposed in a signal path between said input register and said output register, said at least one latch means being responsive to a latch control signal to be non-transmissive during a period matched to said speculation period so as to block a change in said input signal resulting in a change in said output signal during said speculation period.

Viewed from a further aspect the present invention provides a method of operating an integrated circuit comprising the steps of:

providing at least one processing pipeline stage having an input register, processing circuitry coupled to said input register to receive an input signal therefrom, and an output register coupled to said processing circuitry to receive an output signal therefrom;

sampling said output signal with said output register at a speculative sampling point to form a speculative value;

outputting said speculative value from said output register as a downstream input signal to one or more further processing pipeline stages during at least a speculation period; and in response to a change in said output signal during said speculation period, triggering an error recovery operation; wherein at least one latch disposed within said processing circuitry in a signal path between said input register and said output register, is controlled by to a latch control signal to be non-transmissive during a period matched to said speculation period so as to block a change in said input signal resulting in a change in said output signal during said speculation period.

The above, and other objects, features and advantages will be apparent from the following detailed description of illustrative embodiments which is to be read in connection with the accompanying drawings.

DETAILED DESCRIPTION OF EMBODIMENTS

Figure 1:
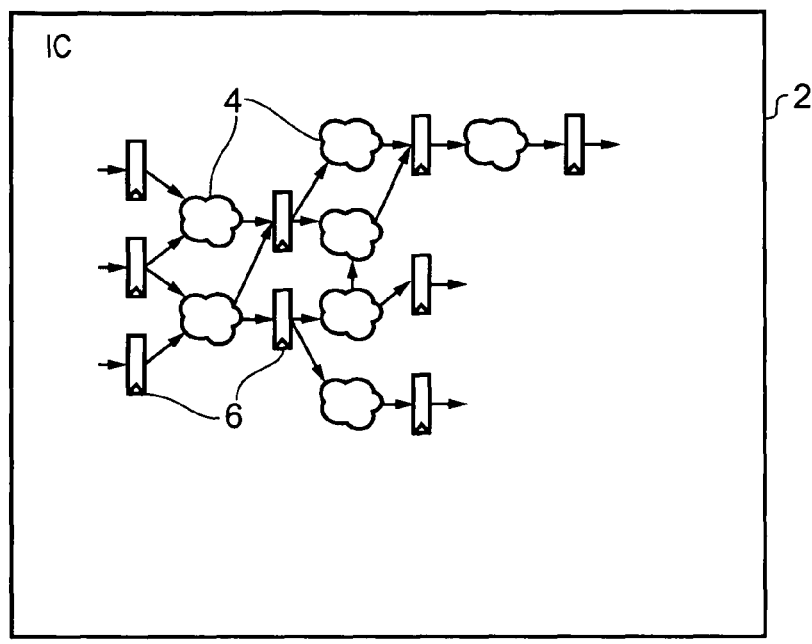
FIG. 1 schematically illustrates an integrated circuit incorporating a processing pipeline(s) having multiple pipeline stages each formed of an input register, processing logic and an output register.

FIG. 1 illustrates an integrated circuit 2 including a plurality of pipeline stages incorporating processing circuitry 4 disposed in signal paths between registers 6. Each register forms an input register for a downstream block of processing circuitry and an output register for outstream block of circuitry (in most circumstances). Signal values are passed along the processing pipeline stages through the processing circuitry 4 and are subject to different processing operations and combinatorial logic operations as they pass along the relevant signal paths. As can be seen in FIG. 1, the signal paths include varying degrees of fan-in and fan-out. The type of pipeline processing arrangement illustrated in FIG. 1 will be familiar to those in this technical field and will not be described further. It will be appreciated that an integrated circuit 2 such as is illustrated in FIG. 1 will typically include many thousands of such pipeline processing stages fulfilling a wide variety of different functions within the integrated circuit 2. The techniques described herein are applicable widely across the integrated circuit within the different functional elements thereof.

Figure 2:
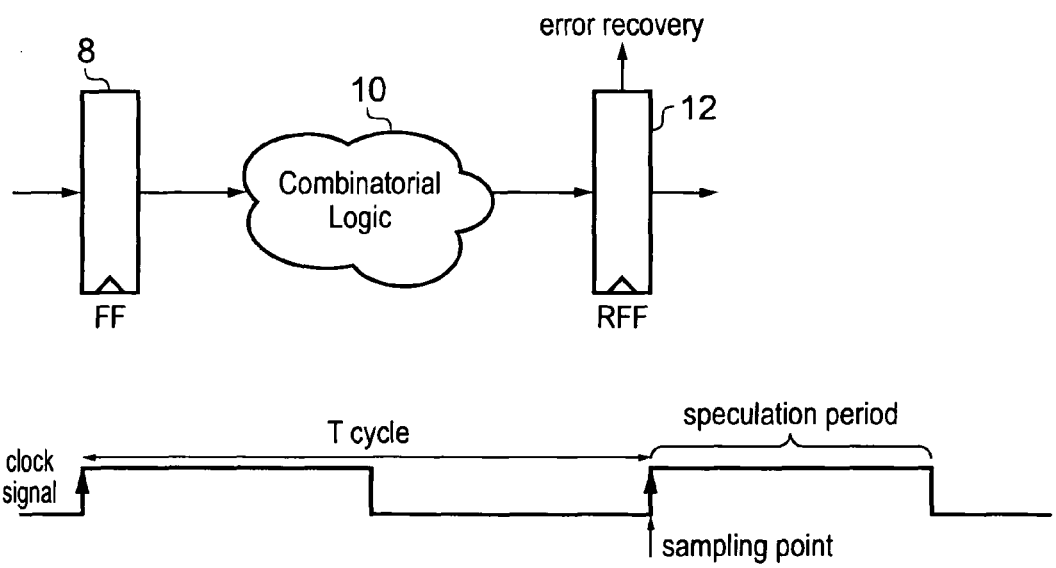
FIG. 2 schematically illustrates a pipeline stage including an output register using speculative sampling.

FIG. 2 schematically illustrates a single pipeline stage comprising an input register 8 in the form of a standard flip-flip, processing circuitry in the form of combinatorial logic 10 and an output register 12 in the form of a "Razor" flip-flop. The output register 12 can be of the form using shadow latches such as described in WO-A-2004/084072. The output latch 12 could alternatively use a transition detector arrangement to detect speculation errors such as is described in US Patent Application No. US-A-2005/246613. The contents of the previously mentioned patent applications are incorporated herein by reference.

The output latch 12 generates an error recovery signal if a speculation error is detected corresponding to a change in the output signal generated by the combinatorial logic 10 during the speculation period. The clock signal illustrated in FIG. 2, which is used to clock both the input register 8 and the output latch 12, has a periodic form with a first phase and a second phase that are substantially equal in length. The sampling point for both the input register 8 and the output register 12 is defined by the positive edge of the flop signal supplied thereto. The speculation period for the output latch 12 (Razor flip-flop RFF) is defined by the positive phase of the clock signal supplied to the output register 12. The output register 12 is responsive to any change in the output signal supplied thereto during the speculation period to generate an error recovery signal.

Figure 3A:
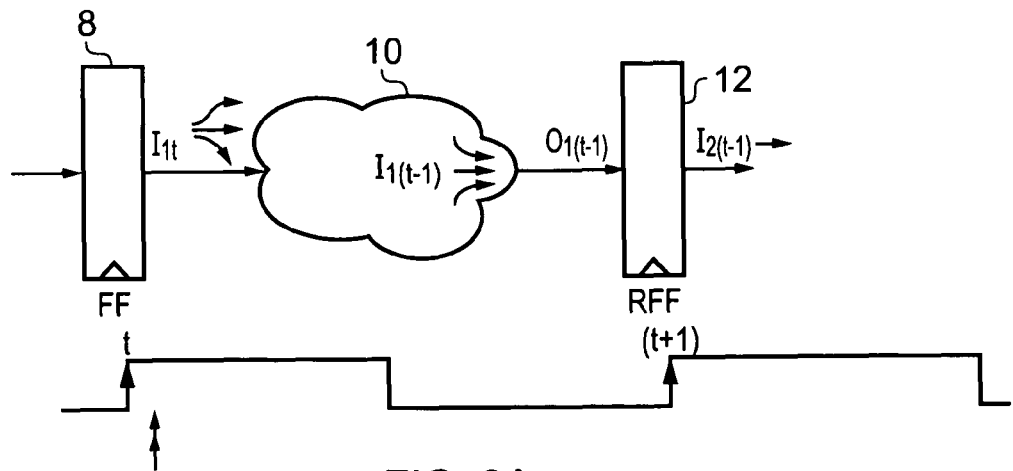
FIGS. 3A, 3B and 3C illustrate the occurrence of a race condition within the circuit of FIG. 2 giving rise to an error.
Figure 3B:
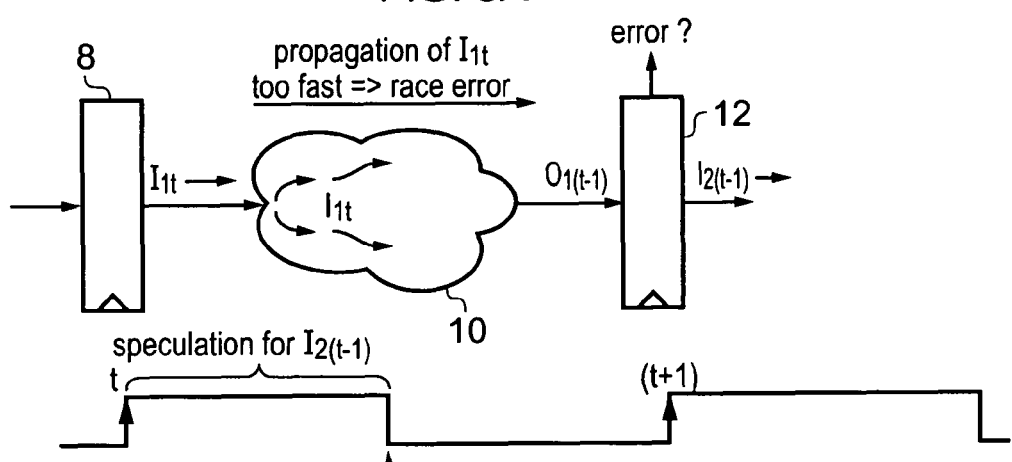
Figure 3C:
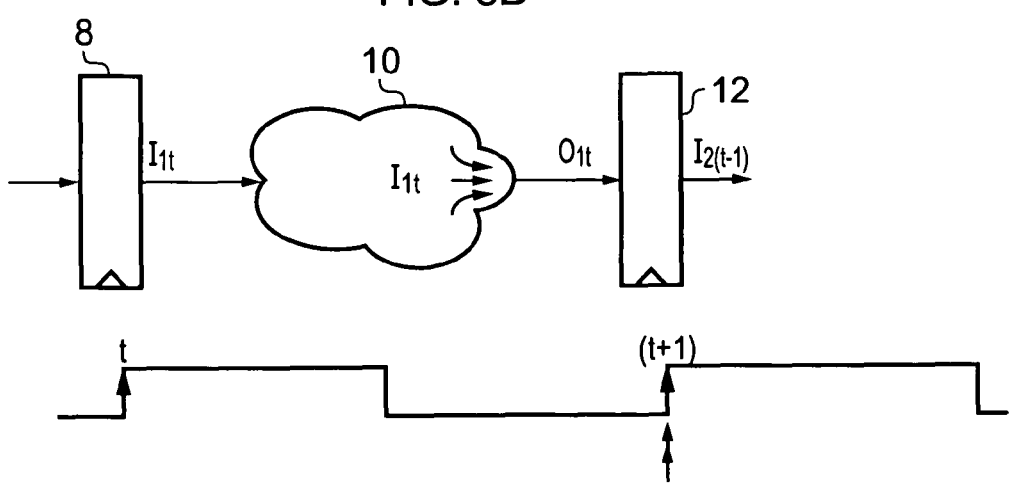

FIGS. 3A, 3B and 3C illustrate the potential occurrence of a race error generated by a propagation signal path which is too short in at least some circumstances. FIG. 3A illustrates a time shortly after the positive edge of the clock signal which has triggered sampling by the input register 8 and the output register 12. The time is illustrated by the double headed arrow on the clock signal form. The input signal during this clock period, which is to be processed by the processing circuit 10, is $I_{1t}$. This signal propagates out from the input register 8 into the combinatorial logic 10. This time period also corresponds to the speculation period within the output register 12 for the previously generated output signal from the combinatorial logic 10 namely $O_{1(t-1)}$. Some signal propagation through the combinatorial logic 10 generating this output signal may still be occurring during the speculation period and may or may not result in a change in the output signal value. If a change does occur, then this indicates a speculation error which is detected by the output register 12. The speculatively sampled value already sampled at the positive clock edge and being output from the output latch 12 as the input signal to the next processing stage is signal $I_{2(t-1)}$.

FIG. 3B illustrates the time just at the end of the speculation period for the preceding processing cycle (t−1). At this time, the input signal for the current processing cycle will have propagated further through the combinatorial logic 10 as is illustrated. In this example, the signal has not propagated too fast and influenced the output signal $O_{1(t-1)}$ in a way which causes it to change value and which would result in a "race" condition giving rise to a false positive detection of a speculation error. If the propagation delay through the combinatorial logic 10 were too low, then the input signal $I_{1t}$ would have propagated through the combinatorial logic 10 to reach its output and possibly change the output signal being supplied to the output register 12 such that a change in the output signal occurred during the speculation period even though the correct value had been captured by the output register 12 at the speculative sampling point.

FIG. 3C illustrates a point just prior to the next speculative sampling point. At this time, the input signal $I_{1t}$ has propagated through the combinatorial logic 10 to the point at which it has changed the output signal $O_{1t}$ to reflect the correct processing result from processing the input signal $I_{1t}$ and this value will be properly sampled and stored within the output register 12 for passing on during the next clock period to the downstream processing pipeline stages.

Figure 4A:
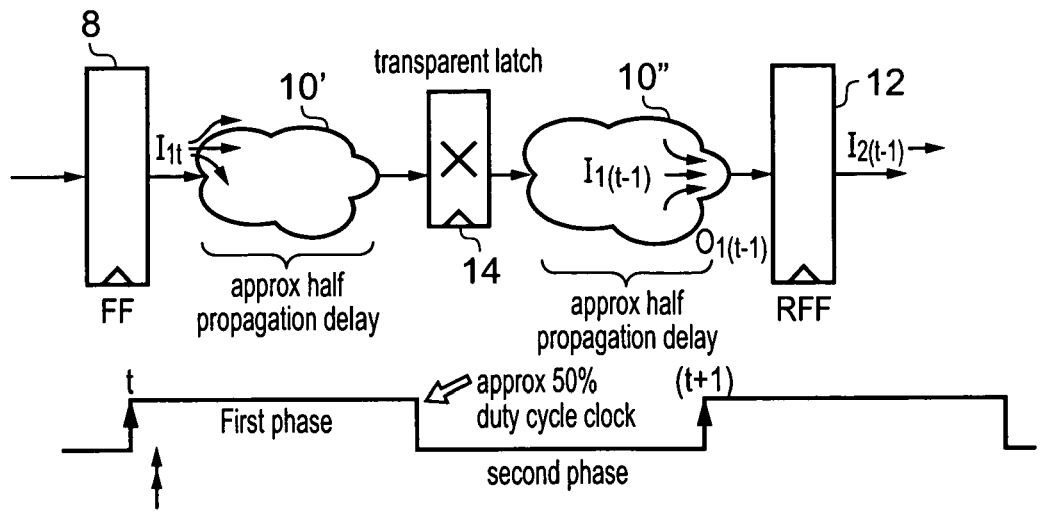
FIGS. 4A, 4B and 4C illustrate a pipeline stage including a transparent latch substantially at the timing midpoint of the processing circuitry for suppressing race errors.

FIG. 4A schematically illustrates a pipeline processing stage incorporating an input register 8, an output register 12 and a transparent latch 14 disposed at an approximate midpoint relative to the propagation delay within the signal path passing through a first portion of combinatorial logic 10' and a second portion of combinatorial logic 10". As illustrated in FIG. 4A, the transparent latch 14 is controlled via the clock signal (shared with the input register 8 and the output register 12) to be non-transmissive during the first phase of the clock signal. Accordingly, the input signal to the combinatorial logic 10' will commence propagation through the first portion of the combinatorial logic 10' during the first phase but will be unable to propagate beyond the transparent latch 14 until the second phase of the clock signal has been reached. Since the speculation period for the output register 12 is controlled to be the first phase of the clock signal, then race conditions giving rise to false positive speculation error detection cannot occur since the input signal $I_{1t}$ is unable to change the output signal $O_{1(t-1)}$ whilst the speculation period is still open. The duty ratio of the clock signal is approximately 50% simplifying its generation and distribution and improving its resistance to process variation. The processing circuitry is divided into a first portion 10' and a second portion 10" that approximately equally divides the propagation delay through that processing circuitry 10', 10" in half. It will be appreciated that the actual circuit area and number of components may not be equal in the two portions 10, 10", but the propagation delay will be substantially equal and it is this that is the target of the splitting. It will be appreciated that no fan-out or fan-in is illustrated in FIG. 4A, but that such fan-out or fan-in will typically be present within the processing stages as is illustrated in FIG. 2. In such circumstances, multiple transparent latches 14 are disposed in those signal paths calculated to be at risk of potential race errors.

Figure 4B:
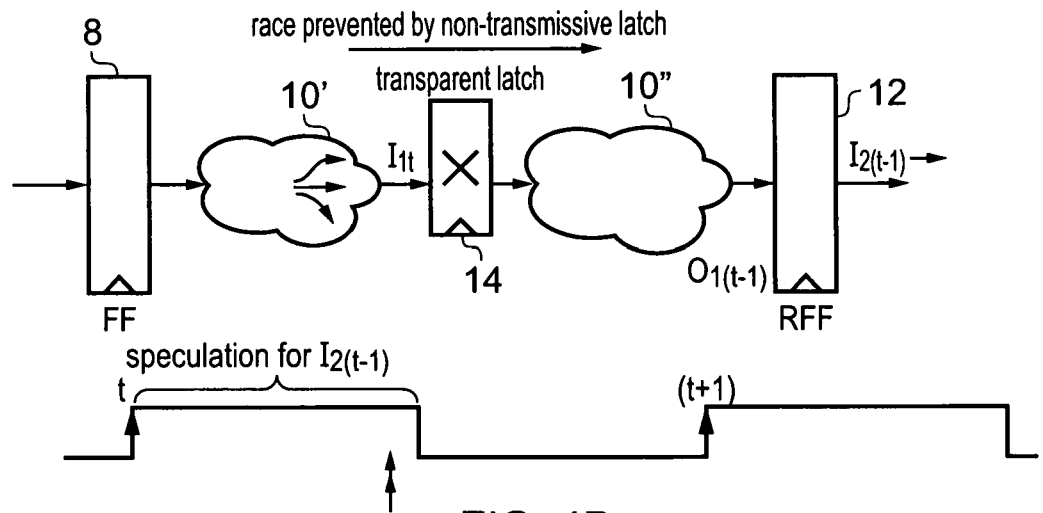

FIG. 4B illustrates the situation just prior to expiry of the speculation period. At this point, the transparent latch 14 is still non-transmissive. The signal value resulting from the input signal $I_{1t}$ has reached the transparent latch 14, but is prevented from propagating further by the transparent latch 14 and accordingly prevented from giving rise to a race error.

Figure 4C:
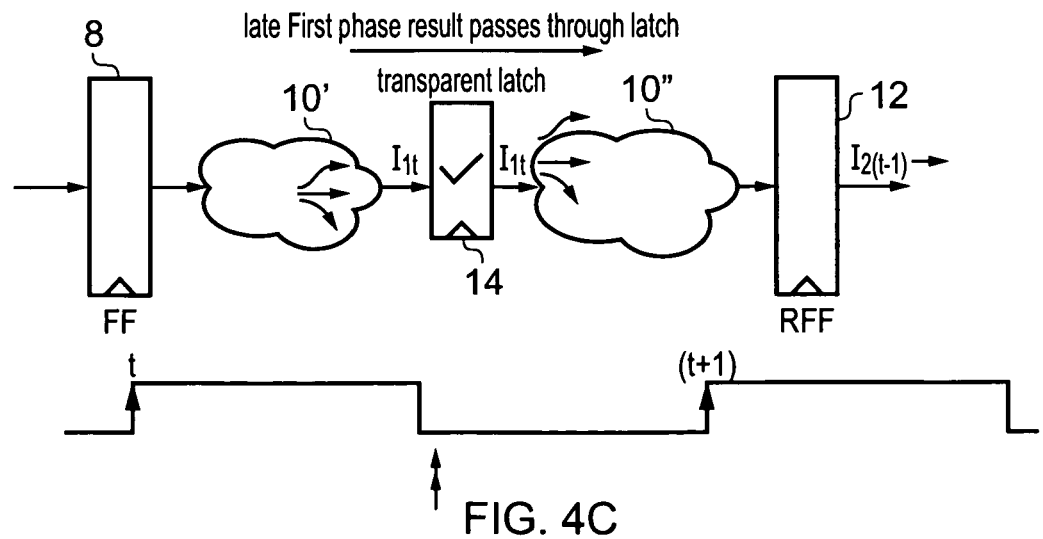

FIG. 4C illustrates the situation just after the expiration of the speculation period. At this time the transparent latch 14 becomes transmissive and accordingly the signal $I_{1t}$ is able to pass therethrough and start to propagate through the second portion 10" of the processing circuitry. In addition, if the signal $I_{1t}$ is late arriving at the transparent latch 14, then since the transparent latch 14 remains transmissive for the whole of the second phase of the clock signal, this later arriving signal $I_{1t}$ can propagate through the transparent latch 14 and make up time in the second portion 10" of the processing circuitry so as to still reach the output register 14 in time to meet any timing constraints.

Figure 5:
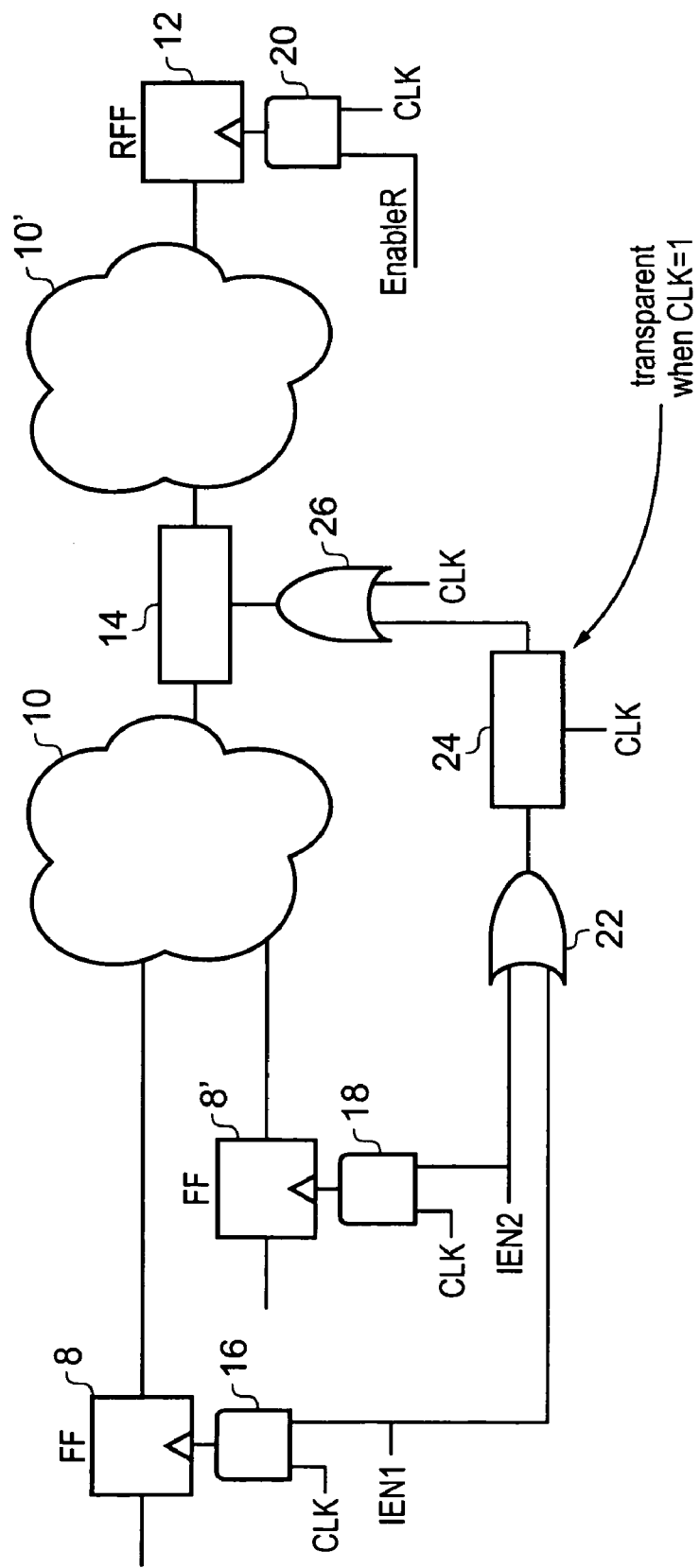
FIG. 5 schematically illustrates the clock control signals used in one example embodiment of the circuits of FIGS. 4A, 4B and 4C.

FIG. 5 schematically illustrates a pipeline stage including two input registers 8, 8'. These supply respective input signals to a first portion of the processing circuitry 10. A transparent latch 14 is disposed between the first portion of the circuitry 10 and a second portion of the processing circuitry 10'. The output signal from the second portion of the processing circuitry 10' is supplied to an output latch 12. Thus, in this example it will be seen that there is a fan-in of two input signals supplied to the first portion of the processing circuitry 10.

The two input registers 8, 8', the latch 14 and the output register 12 are all clocked by a common clock signal CLK. Each of these clock signals is however subject to separate clock control. The input register 8 has its clock gated by signal IEN1. The input register 8' has its clock signal gated by signal IEN2. The output register 12 has its clock signal gated by signal EnableR. The clock gating function associated with each of the control signals for the input registers 8, 8' and the output register 12 is an AND provided by the gates 16, 18 and 20. In order to ensure a well formed clock, the signals IEN1 and IEN2 only change when CLK is low. The enable term for the clock supplied to the latch 14 is an OR provided by gate 22. In this way, if either of the input latches 8, 8' is clocked, then the latch 14 will be open at the appropriate portion of the clock cycle to allow the signal being processed to propagate through the latch 14. As the clock enable signals IEN1 and IEN2 are produced in the previous cycle to that in which the latch 14 is operated, the enable term produced by gate 22 is latched by the action of latch 24 before it is used. The clock gating function for the latch 14 is an OR provided by gate 26. The latch is non-transmissive when its input clock is high.

Although illustrative embodiments have been described in detail herein with reference to the accompanying drawings, it is to be understood that the described technology is not limited to those precise embodiments, and that various changes and modifications can be effected therein by one skilled in the art without departing from the scope and spirit of the invention as defined by the appended claims.

We claim:

1. An integrated circuit comprising:
    at least one processing pipeline stage having an input register, processing circuitry coupled to said input register to receive an input signal therefrom, and an output register coupled to said processing circuitry to receive an output signal therefrom; wherein
    said output register is configured to sample said output signal at a speculative sampling point to form a speculative value, to output said speculative value as a downstream input signal to one or more further processing pipeline stages during at least a speculation period, and to be responsive to a change in said output signal during said speculation period to trigger an error recovery operation; and
    said processing circuitry includes at least one latch disposed in a signal path between said input register and said output register of the same processing pipeline stage, said at least one latch being responsive to a latch control signal to be non-transmissive during a period matched to said speculation period so as to block a change in said input signal resulting in a change in said output signal during said speculation period;
    wherein said processing circuitry includes first combinational circuitry disposed in said signal path between said input register and said latch and second combinational circuitry disposed in said signal path between said latch and said output register.

2. The integrated circuit as claimed in claim 1, wherein each of said at least one latch comprises a transparent latch.

3. The integrated circuit as claimed in claim 1, wherein said processing circuitry includes a plurality of signal paths between said input register and said output register and said processing circuitry includes one or more latches each blocking transmission of a change in said input signal resulting in a change in said output signal during said speculation period.

4. The integrated circuit as claimed in claim 1, comprising a plurality of input registers outputting respective input signals to said processing circuitry.

5. The integrated circuit as claimed in claim 1, wherein a propagation delay along said signal path through said first combinational circuitry is equal to a propagation delay along said signal path through said second combinational circuitry.

6. The integrated circuit as claimed in claim 1, wherein said input register and said output register are triggered to sample by a sampling edge transition of a periodic clock signal comprising a repeating sequence of said sampling edge transition, a first clock phase, a non-sampling edge and a second clock phase.

7. The integrated circuit as claimed in claim 6, wherein said output register is responsive to said non-sampling edge to end said speculation period such that said speculation period corresponds to said first clock phase.

8. The integrated circuit as claimed in claim 6, wherein said latch control signal comprises said periodic clock signal with said at least one latch being switched to a non-transmissive state during said first clock phase.

9. The integrated circuit as claimed in claim 8, wherein said latch control signal is clock gated in dependence upon clock gating applied to said input register.

10. The integrated circuit as claimed in claim 6, wherein a duration of said first clock phase is equal to a duration of said second clock phase.

11. The integrated circuit as claimed in claim 1, wherein said output register samples said output value at expiry of said speculation period to form a non-speculative value and compares said speculative value with said non-speculative value to detect said change in said output signal during said speculation period.

12. The integrated circuit as claimed in claim 1, wherein said output register includes a transition detector responsive to a transition in said output value during said speculative period to detect said change in said output signal during said speculation period.

13. An integrated circuit comprising:
    at least one processing pipeline stage having input register means, processing means coupled to said input register means for receiving an input signal therefrom, and an output register means coupled to said processing means for receiving an output signal therefrom; wherein
    said output register means samples said output signal at a speculative sampling point to form a speculative value, outputs said speculative value as a downstream input signal to one or more further processing pipeline stages during at least a speculation period, and is responsive to a change in said output signal during said speculation period to trigger an error recovery operation; and
    said processing means includes at least one latch means disposed in a signal path between said input register means and said output register means of the same processing pipeline stage, said at least one latch means being responsive to a latch control signal to be non-transmissive during a period matched to said speculation period so as to block a change in said input signal resulting in a change in said output signal during said speculation period;
    wherein said processing means includes first combinational means disposed in said signal path between said input register means and said latch means and second combinational means disposed in said signal path between said latch means and said output register means.

14. A method of operating an integrated circuit comprising the steps of:

provided at least one processing pipeline stage having an input register, processing circuitry coupled to said input register to receive an input signal therefrom, and an output register coupled to said processing circuitry to receive an output signal therefrom;

sampling said output signal with said output register at a speculative sampling point to form a speculative value;

outputting said speculative value from said output register as a downstream input signal to one or more further processing pipeline stages during at least a speculation period; and in response to a change in said output signal during said speculation period, triggering an error recovery operation; wherein at least one latch disposed within said processing circuitry in a signal path between said input register and said output register of the same proeessin pipeline stage, is controlled by a latch control signal to be non-transmissive during a period matched to said speculation period so as to block a change in said input signal resulting in a change in said output signal during said speculation period; and wherein said processing circuitry includes first combinational circuitry disposed in said signal path between said input register and said latch and second combinational circuitry disposed in said signal path between said latch and said output register.

15. The method as claimed in claim 14, wherein each of said at least one latch comprises a transparent latch.

16. The method as claimed in claim 14, wherein said processing circuitry includes a plurality of signal paths between said input register and said output register and said processing circuitry includes one or more latches each blocking transmission of a change in said input signal resulting in a change in said output signal during said speculation period.

17. The method as claimed in claim 14, wherein said step of providing provides a plurality of input registers outputting respective input signals to said processing circuitry.

18. The method as claimed in claim 14, wherein a propagation delay along said signal path through said first combinational circuitry is equal to a propagation delay along said signal path through said second combinational circuitry.

19. The method as claimed in claim 14, wherein said input register and said output register are triggered to sample by a sampling edge transition of a periodic clock signal comprising a repeating sequence of said sampling edge transition, a first clock phase, a non-sampling edge and a second clock phase.

20. The method as claimed in claim 19, wherein said output register is responsive to said non-sampling edge to end said speculation period such that said speculation period corresponds to said first clock phase.

21. The method as claimed in claim 19, wherein said latch control signal comprises said periodic clock signal with said transparent at least one latch being switched to a non-transmissive state during said first clock phase.

22. The method as claimed in claim 21, wherein said latch control signal is clock gated in dependence upon clock gating applied to said input register.

23. The method as claimed in claim 19, wherein a duration of said first clock phase is equal to a duration of said second clock phase.

24. The method as claimed in claim 14, wherein said output register samples said output value at expiry of said speculation period to form a non-speculative value and compares said speculative value with said non-speculative value to detect said change in said output signal during said speculation period.

25. The method as claimed in claim 14, wherein said output register includes a transition detector responsive to a transition in said output value during said speculative period to detect said change in said output signal during said speculation period.

* * * * *